(12) United States Patent
Houston

(10) Patent No.: US 8,315,086 B1
(45) Date of Patent: *Nov. 20, 2012

(54) SRAM STRAP ROW WELL CONTACT

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/301,132

(22) Filed: Nov. 21, 2011

Related U.S. Application Data

(60) Provisional application No. 61/418,280, filed on Nov. 30, 2010.

(51) Int. Cl.
*G11C 11/00* (2006.01)

(52) U.S. Cl. .................... 365/154; 365/230.08; 438/223; 257/E21.63

(58) Field of Classification Search .................. 365/154, 365/230.08; 438/223; 257/E21.63
See application file for complete search history.

(56) References Cited

U.S. PATENT DOCUMENTS

| | | | |
|---|---|---|---|
| 6,285,088 B1* | 9/2001 | Madan | 257/202 |
| 6,569,723 B2* | 5/2003 | Liaw | 438/153 |
| 6,922,354 B2* | 7/2005 | Ishikura et al. | 365/154 |
| 7,906,389 B2* | 3/2011 | Liaw | 438/223 |
| 7,973,371 B2* | 7/2011 | Furuta et al. | 257/393 |

OTHER PUBLICATIONS

U.S. Appl. No. 13/301,217, filed Nov. 21, 2011, entitled "SRAM Strap Row Substrate Contact,".
U.S. Appl. No. 13/301,287, filed Nov. 21, 2011 entitled "SRAM Strap Double Well Contact,".

* cited by examiner

*Primary Examiner* — Connie Yoha
(74) *Attorney, Agent, or Firm* — Rose Alyssa Keagy; Wade J. Brady, III; Frederick J. Telecky, Jr.

(57) ABSTRACT

An integrated circuit containing an SRAM array having a strap row and an SRAM cell row. The strap row includes a tap connecting region that connects two columnar regions of a first polarity well. The strap row also includes a well tap active area in a tap connecting well region. The well tap active area includes a tap layer and a well contact plug that is disposed on the top surface of the tap layer.

9 Claims, 5 Drawing Sheets

SRAM STRAP ROW WELL CONTACT

CROSS-REFERENCE TO RELATED APPLICATIONS

This application claims the benefit of priority under U.S.C. §119(e) of U.S. Provisional Application 61/418,280 (entitled "SRAM Strap Row Well Contact in a Tap Connecting Well Region"), filed Nov. 30, 2010, the entirety of which is incorporated herein by reference.

Furthermore, this application is related to:

Patent application Ser. No. 13/301,287 (filed Nov. 21, 2011) entitled "SRAM STRAP ROW DOUBLE WELL CONTACT," and Patent application Ser. No. 13/301,217 (filed Nov. 21, 2011) entitled "SRAM STRAP ROW SUBSTRATE CONTACT."

With their mention in this section, these patent applications are not admitted to be prior art with respect to the present invention; patent application Ser. No. 13/301,132 (filed Nov. 21, 2011).

BACKGROUND OF THE INVENTION

This invention relates to the field of integrated circuits. More particularly, this invention relates to the strap row of static random access memories (SRAMs) in an integrated circuit.

DETAILED DESCRIPTION

Figure 1A:
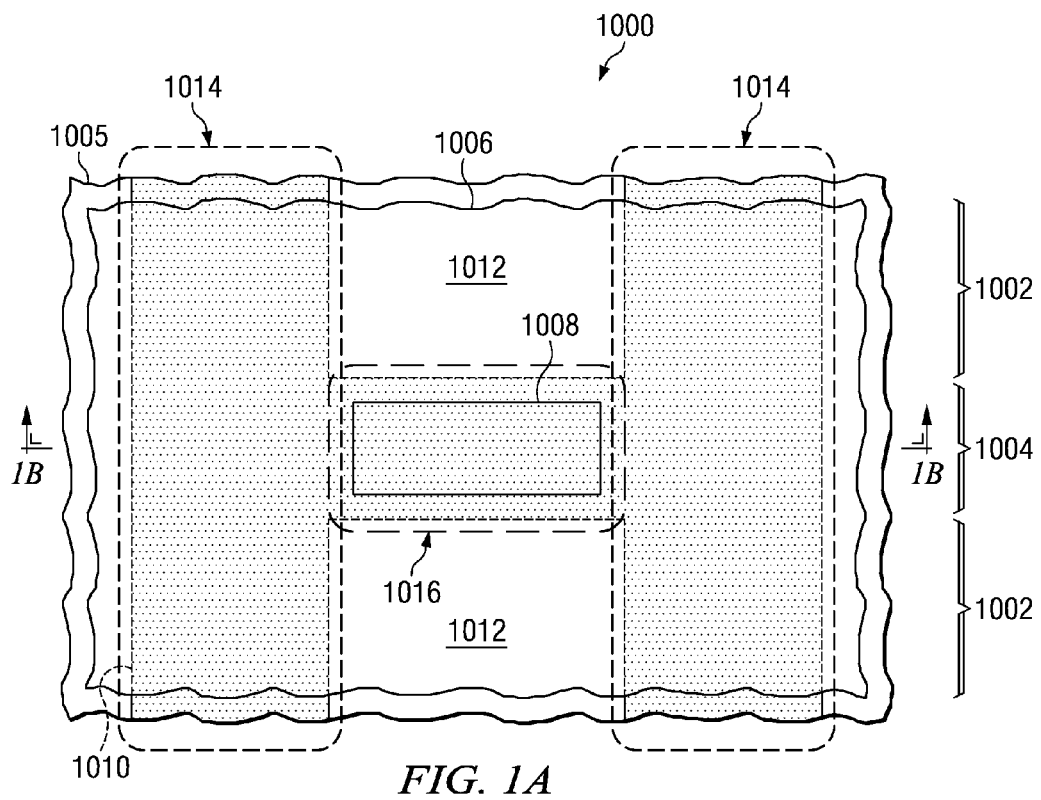
FIG. 1A through FIG. 1F are top views and cross sections of an integrated circuit containing an SRAM array with a strap row which includes a well contact structure.

The example embodiments are described with reference to the attached figures, wherein like reference numerals are used throughout the figures to designate similar or equivalent elements. The figures are not drawn to scale and they are provided merely to illustrate the example embodiments. Several aspects are described below with reference to example applications for illustration. It should be understood that numerous specific details, relationships, and methods are set forth to provide a full understanding of the example embodiments. One skilled in the relevant art, however, will readily recognize that the example embodiments can be practiced without one or more of the specific details or with other methods. In other instances, well-known structures or operations are not shown in detail to avoid obscuring the embodiment. The example embodiments are not limited by the illustrated ordering of acts or events, as some acts may occur in different orders and/or concurrently with other acts or events. Furthermore, not all illustrated acts or events are required to implement a methodology in accordance with the example embodiments.

A static random access memory (SRAM) cell includes a first set of p-type semiconductor regions which contain n-channel metal oxide semiconductor (NMOS) transistors, and a second set of n-type semiconductor regions which contain p-channel metal oxide semiconductor (PMOS) transistors. In a commonly used configuration of an SRAM cell formed on a monolithic p-type substrate, the p-type regions are directly contacting the substrate so that the p-type regions are electrically connected to other p-type regions through the substrate. In this configuration, the p-type regions may be referred to as p-wells (or substrate regions) and the n-type regions may be referred to as n-wells. In an alternate configuration of an SRAM cell formed on a monolithic n-type substrate, in which the n-type regions are directly contacting the substrate, the n-type regions may be referred to as n-wells (or substrate regions) and the p-type regions may be referred to as p-wells.

In another configuration where an SRAM cell is formed on a monolithic p-type substrate, the p-type regions may be electrically isolated from the substrate by a deep n-well that is sometimes referred to as an isolation n-well. This isolation n-well may directly contact (thereby electrically connecting) the n-type regions. Alternatively, the SRAM cell may be formed on a monolithic n-type substrate where the n-type regions may be electrically isolated from the substrate by a deep p-well that is sometimes referred to as an isolation p-well. This isolation p-well may directly contact (thereby electrically connecting) the p-type regions. In a further configuration, an SRAM cell may be formed on a silicon-on-insulator (SOI) substrate. In each of these configurations, the p-type regions are called p-wells and the n-type regions are called n-wells.

For the purposes of this disclosure, active areas are understood to be areas of a semiconductor wafer that are located in the openings of a field oxide layer. Active areas having a same conductivity type as the wells under the active areas are referred to as tap areas. Therefore, tap regions may be used to form electrical contact to the underlying wells.

FIG. 1A through FIG. 1F are top views and cross sections of an integrated circuit containing an SRAM with a strap row that includes a well contact structure that is formed according to an embodiment (and depicted in successive stages of fabrication). Referring to the top view of FIG. 1A, an integrated circuit 1000 contains a portion of an SRAM array that includes areas defined for SRAM cell rows 1002 and an area defined for a strap row 1004. Each SRAM cell row area 1002 will typically contain a plurality of rows of SRAM cells.

The integrated circuit 1000 also contains a layer of field oxide 1006 that is formed at a top surface of a semiconductor substrate 1005. A well tap active area 1008 is located in the strap row 1004 in an opening formed in the field oxide 1006.

A first polarity well 1010 may be formed by ion implanting a well dopant species of the first polarity into the substrate 1005. The first polarity well 1010 is depicted with a stipple pattern in FIG. 1A, FIG. 1C and FIG. 1E. The first polarity well 1010 alternates with second polarity wells 1012 in the SRAM cell rows 1002 in the instant embodiment. The second polarity wells 1012 has an opposite conductivity type from the first polarity well 1010.

In one version of the instant embodiment, the integrated circuit 1000 may be formed on a monolithic p-type substrate without an isolation well, the first polarity well 1010 may be n-type, and the second polarity wells 1012 may be p-type and they may electrically contact the substrate 1005. In such a version, it will be recognized that an operation to provide doping to the second polarity wells 1012 (such as a well implant) may not be performed. In another version, the integrated circuit 1000 may be formed on a monolithic n-type substrate without an isolation well, the first polarity well 1010 may be p-type, and the second polarity wells 1012 may be n-type and they may electrically contact the substrate. In a further version, an isolation well may be formed under the first polarity well 1010 and the second polarity wells 1012.

In the instant embodiment, the first polarity well 1010 includes columnar regions 1014 which cross the strap row 1004 and extend into adjacent SRAM cell rows 1002. The first polarity well 1010 also includes a tap connecting region 1016 that is located in the strap row 1004. This tap connecting region 1016 is connected to adjacent column regions 1014 of the first polarity well 1010. Moreover, at least a portion of the well tap active area 1008 is located in the tap connecting region 1016.

Figure 1B:
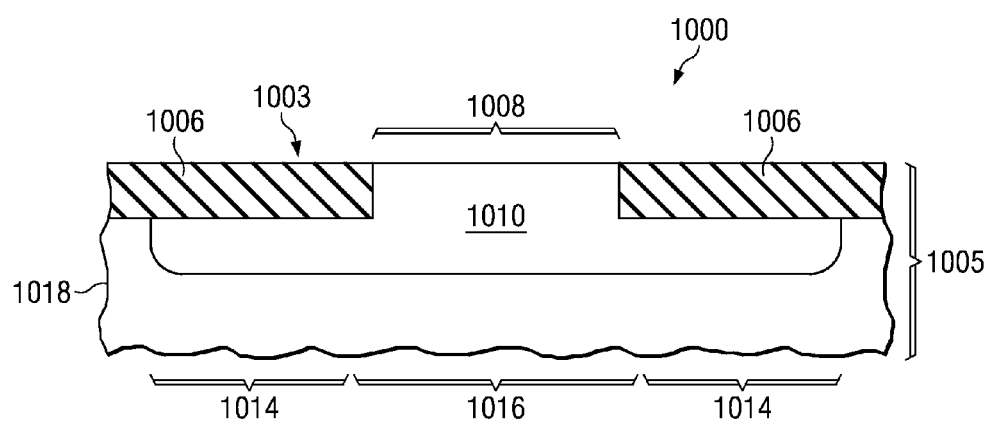

Referring to FIG. 1B (which is a cross section along the section line 1B-1B of FIG. 1A), the field oxide 1006 is formed at a top surface 1003 of the substrate 1005. A connecting layer 1018 under the first polarity well 1010 may be the substrate 1005 or may be an isolation well. Moreover, in a version of the instant embodiment where the SRAM array is formed on an SOI substrate; the connecting layer 1018 may not be present. The well tap active area 1008 is an opening in the field oxide 1006. The first polarity well 1010 extends throughout the well tap active area 1008 and under a portion of the adjacent layers of field oxide 1006 so as to connect adjacent columnar regions 1014. A bottom surface of the well 1010 is below a bottom surface of the field oxide 1006.

Figure 1C:
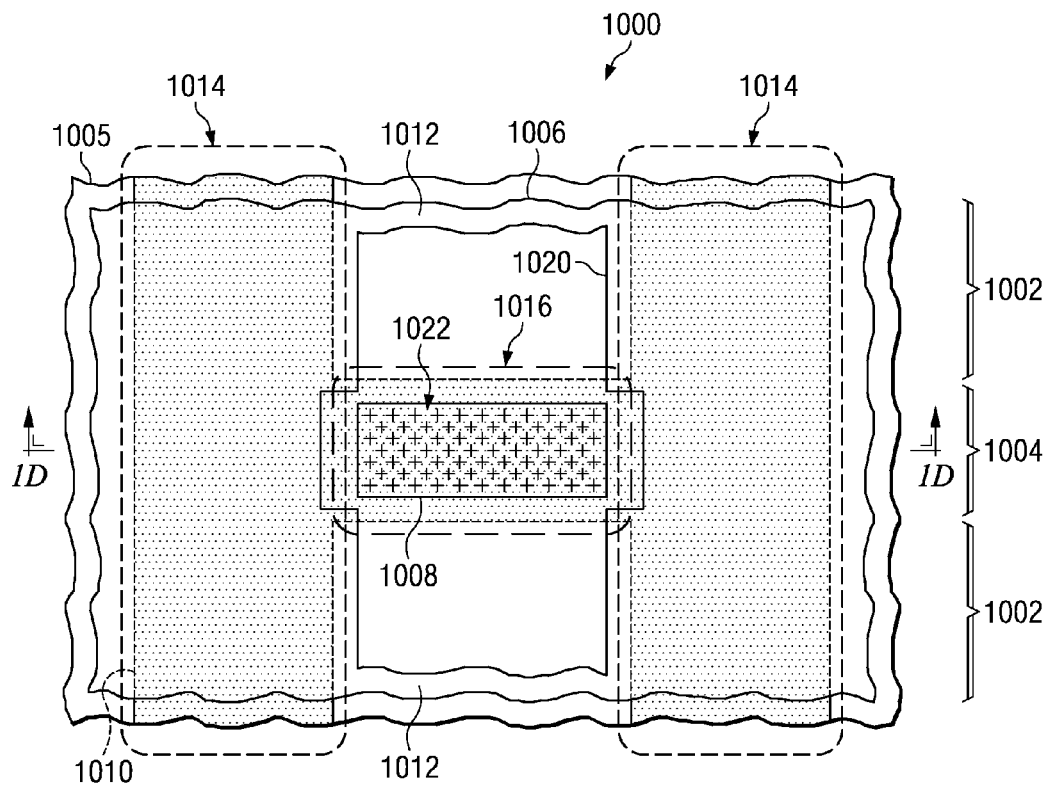
Figure 1D:
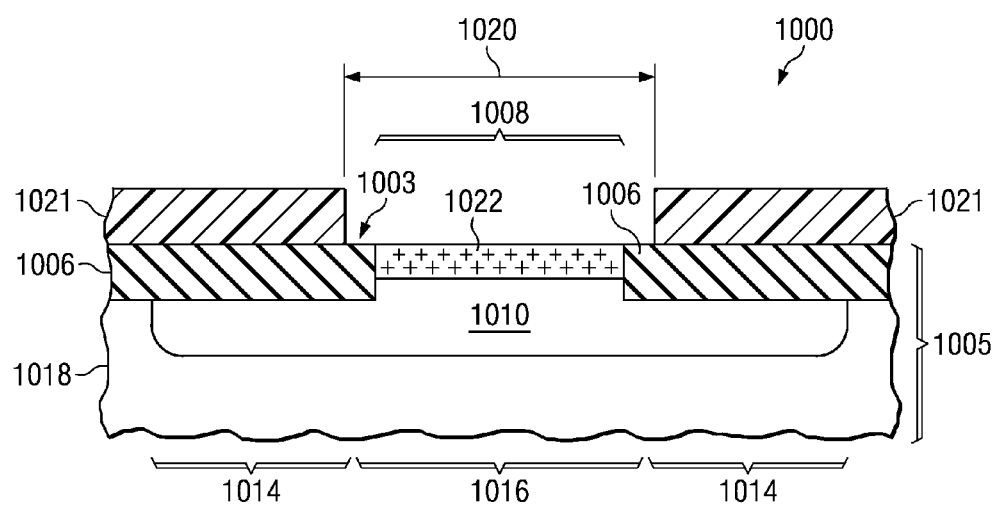

Referring to the top view of FIG. 1C, source/drain/tap dopants are implanted into the top surface 1003 of the integrated circuit 1000 using an implant mask 1021 (not shown in FIG. 1C but shown in FIG. 1D). The implant mask has an opening in the source/drain/tap area 1020. The source/drain/tap area 1020 extends continuously across the strap row area 1004 and into the second polarity wells 1012 of the SRAM cell rows 1002 that are adjacent to the strap row area 1004. The source/drain/tap area 1020 is used to allow the implantation of dopants into the second polarity wells 1012 to create the source and drain regions for the transistors in SRAM cells. In the instant embodiment, the dopants that are implanted through the source/drain/tap area 1020 are the same conductivity type as the first polarity well 1010. The dopants implanted into the source/drain/tap area 1020 that is located over the well tap active area 1008 form a tap layer 1022. The tap layer 1022 is depicted in FIG. 1C with a "+" pattern. The dopants implanted into this tap layer 1022 create an electrical connection to the columnar regions 1014 of the first polarity well 1010 through the tap connecting region 1016.

As shown in FIG. 1D (which is a cross section along the section line 1D-1D of FIG. 1C), the source/drain/tap area 1020 is utilized for the implantation process by creating an opening in the implant mask 1021 (that extends across the well tap active area 1008 and partially over the adjacent regions of field oxide 1006). In the instant embodiment, the tap layer 1022 does not extend below the bottom surface of the field oxide 1006. (The tap area 1022 is depicted in FIG. 1D with an "+" pattern.)

Figure 1E:
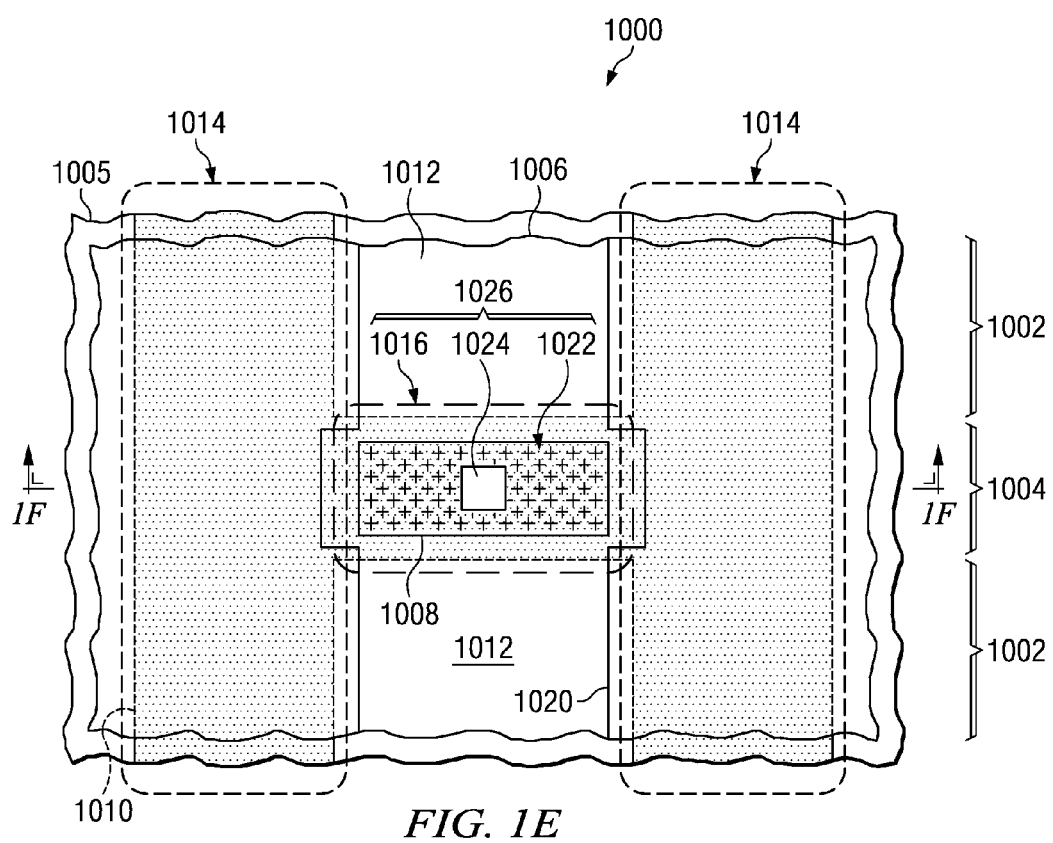

Referring to the top view of FIG. 1E, a well contact plug 1024 is formed over the tap layer 1022 (in the well tap active area 1008). A well contact structure 1026 is formed by the combination of the tap connecting region 1016, the well contact plug 1024, and the tap area 1022.

Figure 1F:
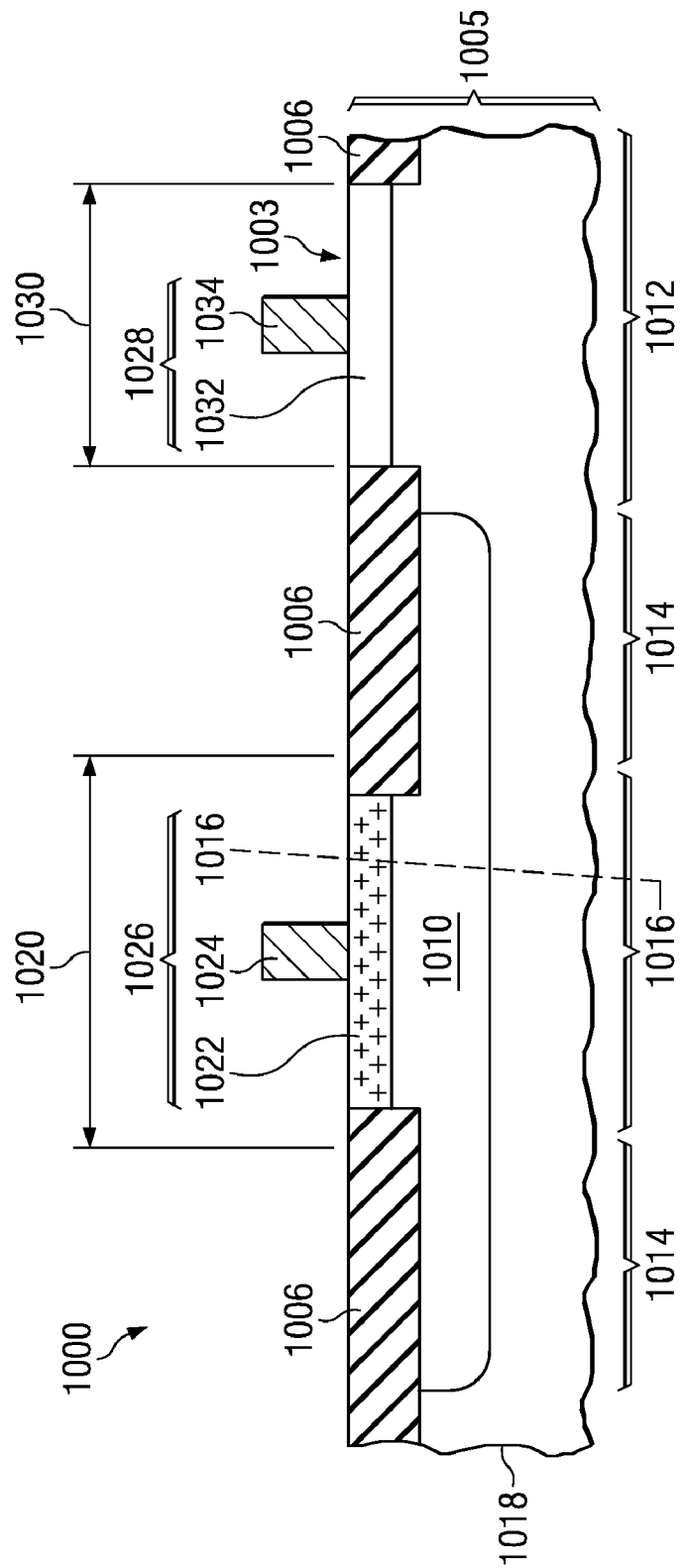

As shown in FIG. 1F (which is a cross section along the section line 1F-1F of FIG. 1E), the well contact plug 1024 is located on a top surface 1003 of the tap layer 1022 within the source/drain/tap area 1020. The well contact structure 1026 provides an electrical connection between the well contact plug 1024 and the first polarity well 1010. The top surface 1003 of the tap area 1022 may include a layer of metal silicide or other electrically conductive material.

Referring again to FIG. 1E, the strap row 1004 containing the well contact structure 1026 may be narrower (e.g. have less distance between adjacent SRAM cell rows 1002) than an area used by a strap row containing a well contact structure disposed completely in the columnar region 1014 that does not include a tap connecting region 1016. Forming a narrower strap row 1004 may provide a reduction of the total area occupied by the SRAM within the integrated circuit 1000. It will also be recognized that a strap row 1004 may contain more than one instance of the well contact structure.

A second polarity well contact structure 1028 that makes electrical connection to an instance of the second polarity wells 1012 is also depicted in FIG. 1F. The second polarity well contact structure 1028 may include, for example, a second polarity tap layer 1032 (having the same conductivity type as the second polarity wells 1012) and a second polarity well tap contact 1034 on the top surface 1003 of the second polarity tap layer 1032. Instances of the second polarity well contact structure 1028 may be disposed in a second polarity well tap active area 1030 of the strap row 1004 along with instances of the well contact structure 1026. Instances of the second polarity well contact structure 1028 may also be disposed in the integrated circuit 1000 in locations that are peripheral to the SRAM cell rows 1002.

Figure 2:
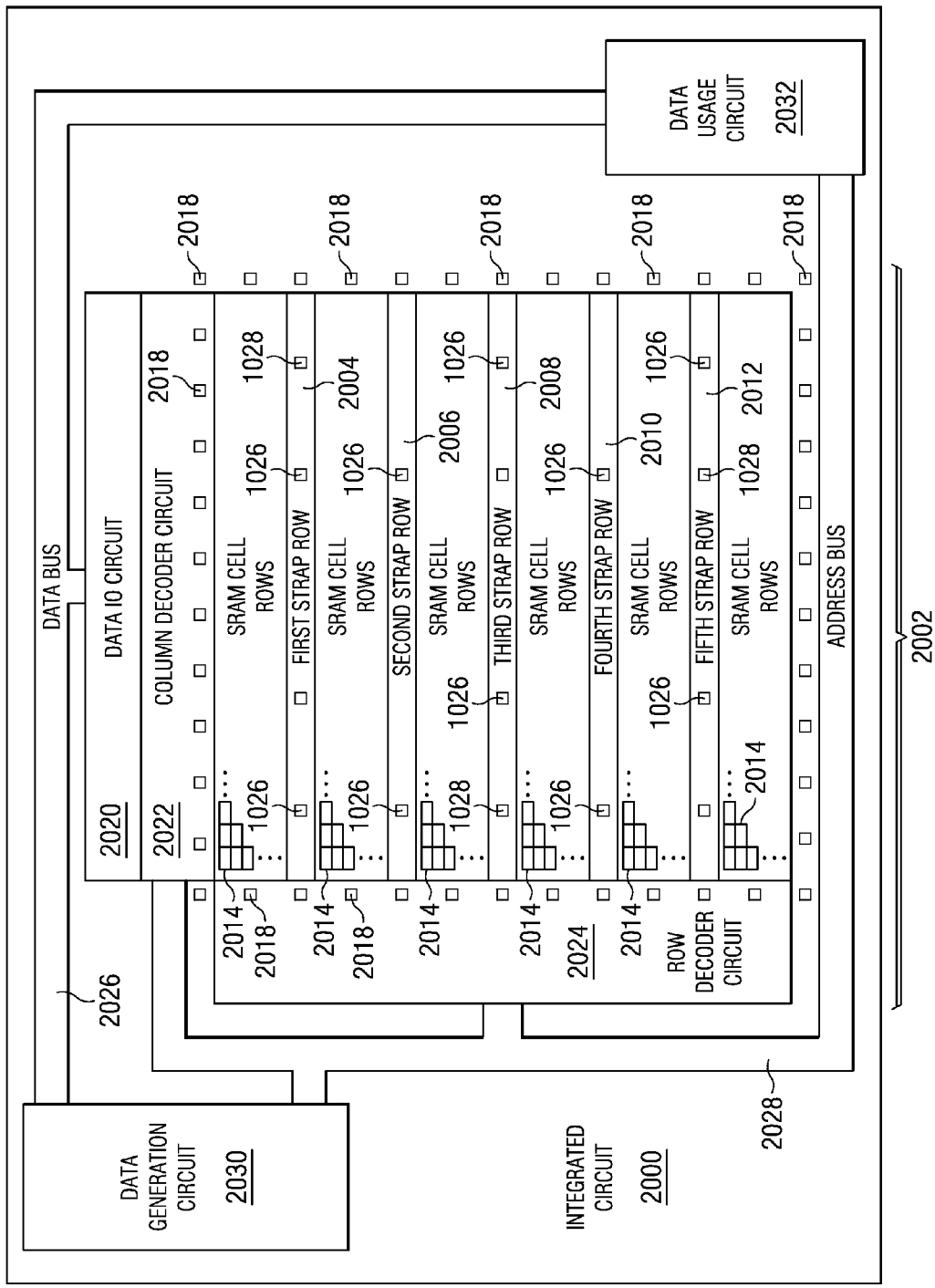
FIG. 2 is a top view of an integrated circuit containing an SRAM array that includes one or more strap rows.

FIG. 2 is a top view of an integrated circuit 2000 containing an SRAM array 2002 which includes one or more strap rows 2004, 2006, 2008, 2010, 2012. Rows of SRAM cells 2014 are formed between the strap rows 2004, 2006, 2008, 2010, 2012. In one version of the instant embodiment, all of the strap rows 2004, 2006, 2008, 2010, 2012 may have substantially identical configurations of the well contact structures 1026 discussed in reference to FIG. 1A through FIG. 1F.

In another version of the instant embodiment, the strap rows 2004, 2006, 2008, 2010, 2012 may have different configurations of well contact structures. For example, strap rows 2004, 2008 and 2012, may contain instances of the well contact structures 1026 plus instances of the second polarity well contact structures 1028 (discussed in reference to FIG. 1F). Conversely, strap rows 2006 and 2010 may contain instances of the well contact structures 1026 but no instances of the second polarity well contact structures 1028. Additionally, peripheral well contact structures 2018 (similar to the second polarity well contact structures 1028 discussed in reference to FIG. 1F) may be formed at a periphery of the rows of SRAM cells 2014 to provide electrical connection to the second polarity wells in the rows of SRAM cells 2014.

A data input/output (IO) circuit 2020 is usually located adjacent to the rows of SRAM cells 2014. The data IO circuit 2020 writes data bits to and reads data bits from the SRAM cells 2014. A column decoder circuit 2022 is also usually located adjacent to the rows of SRAM cells 2014 and it controls entire columns of SRAM cells 2014. In addition, a row decoder circuit 2024 is usually located adjacent to the rows of SRAM cells 2014 and it controls entire rows of SRAM cells 2014. The column decoder circuit 2022 and the row decoder circuit 2024 select SRAM cells 2014 during read and write operations.

The integrated circuit further includes a data bus 2026. The data bus 2026 interfaces to the data IO circuit 2020, possibly to a data generation circuit 2030, and possibly to a data usage circuit 2032.

The integrated circuit also includes an address bus 2028 that is connected to the row decoder circuit 2024 and the column decoder circuit 2022. In addition, the address bus 2028 may interface to the data generation circuit 2030 and to the data usage circuit 2032.

While various example embodiments have been described above, it should be understood that they have been presented by way of example only and not limitation. Numerous changes to the disclosed embodiments can be made in accordance with the disclosure herein without departing from the spirit or scope of the example embodiments. Thus, the breadth and scope of the example embodiments should not be limited. Rather, the scope of the example embodiments should be defined in accordance with the following claims and their equivalents.

What is claimed is:

1. An integrated circuit containing an SRAM array, comprising:
   a substrate of said integrated circuit;
   an SRAM cell row disposed in said SRAM array, said SRAM cell row containing a plurality SRAM cells;
   a strap row disposed in said SRAM array and located adjacent to said SRAM cell row;
   a layer of field oxide disposed in a top surface of said SRAM array;
   a first polarity well of a first conductivity type disposed in said SRAM array, said first polarity well including:
      a first columnar region and a second columnar region, said first and second columnar regions extending through said SRAM cell row and said strap row; and
      a tap connecting region located in said strap row, said tap connecting region connecting said first and second columnar regions;
   a second polarity well of a second conductivity type disposed in said SRAM cell row between said first and second columnar regions, said second conductivity type being opposite from said first conductivity type;
   a well tap active area located in said strap row and formed by an opening in said layer of field oxide, so that at least a portion of said well tap active area is located in said tap connecting region;
   a tap layer disposed in said well tap active area, said tap layer having said second conductivity type, so as to provide an electrical connection to said first and second columnar regions of said first polarity well through said tap connecting region; and
   a well contact plug located on a top surface of said substrate on said tap layer in said well tap active area, so that a combination of said tap connecting region, said tap layer in said well tap active area, and said well contact plug forms a well contact structure.

2. The integrated circuit of claim 1, in which said strap row further includes a second polarity well contact structure coupled to said second polarity well.

3. The integrated circuit of claim 1, in which said SRAM array further includes a second polarity well contact structure located peripheral to said SRAM cell row an coupled to said second polarity well.

4. The integrated circuit of claim 1, in which:
   said first conductivity type is n-type; and
   said second conductivity type is p-type.

5. The integrated circuit of claim 1, in which said strap row is free of a second polarity well contact structure coupled to said second polarity well.

6. The integrated circuit of claim 1 further including:
   a second SRAM cell row disposed in said SRAM array, said second SRAM cell row containing a plurality of rows of SRAM cells;
   a second instance of said second polarity well extending through said second SRAM cell row;
   a second strap row disposed in said SRAM array and located adjacent to said second SRAM cell row; and
   a second instance of said well contact structure disposed in said second strap row.

7. The integrated circuit of claim 6, in which:
   said first strap row is free of a second polarity well contact structure coupled to said second polarity well; and
   said second strap row includes a second polarity well contact structure coupled to said second polarity well.

8. The integrated circuit of claim 1, further including:
   a data input/output circuit coupled to said SRAM cell row;
   a data bus coupled to said data input/output circuit; and
   a data generation circuit coupled to said data input/output circuit.

9. The integrated circuit of claim 1, further including:
   a data input/output circuit coupled to said SRAM cell row;
   a data bus coupled to said data input/output circuit; and
   a data usage circuit coupled to said data input/output circuit.

* * * * *